United States Patent
Masten, Jr.

(10) Patent No.: US 11,029,341 B2
(45) Date of Patent: Jun. 8, 2021

(54) LOW-NOISE, LARGE DYNAMIC-RANGE SENSOR FOR MEASURING CURRENT

(71) Applicant: James William Masten, Jr., Everett, WA (US)

(72) Inventor: James William Masten, Jr., Everett, WA (US)

( * ) Notice: Subject to any disclaimer, the term of this patent is extended or adjusted under 35 U.S.C. 154(b) by 0 days.

(21) Appl. No.: 17/086,125

(22) Filed: Oct. 30, 2020

(65) Prior Publication Data

US 2021/0132120 A1 May 6, 2021

Related U.S. Application Data

(60) Provisional application No. 62/929,657, filed on Nov. 1, 2019.

(51) Int. Cl.
*G01R 15/18* (2006.01)
*G01R 19/00* (2006.01)

(52) U.S. Cl.
CPC ......... *G01R 15/18* (2013.01); *G01R 19/0092* (2013.01)

(58) Field of Classification Search
CPC .. G01R 15/18; G01R 19/0092; G01R 33/091; G01R 33/072; G01R 15/205; G01V 3/081
USPC ...................................................... 324/123 R
See application file for complete search history.

(56) References Cited

U.S. PATENT DOCUMENTS

| | | | | |
|---|---|---|---|---|
| 6,221,671 B1* | 4/2001 | Groner | ............... | G01N 15/1456 356/73 |
| 6,963,195 B1* | 11/2005 | Berkcan | ............... | G01R 15/181 324/117 R |
| 10,175,306 B1* | 1/2019 | Miesner | ............... | G01R 33/072 |
| 2005/0156587 A1* | 7/2005 | Yakymyshyn | ....... | G01R 15/207 324/117 R |
| 2007/0231872 A1* | 10/2007 | Butters | ................ | G01N 37/005 435/173.1 |
| 2011/0221437 A1* | 9/2011 | Stockum | ............. | G01R 33/072 324/252 |
| 2018/0136257 A1* | 5/2018 | Steuer | .................... | G01R 15/14 |
| 2018/0335485 A1* | 11/2018 | Masuda | ............ | G01R 33/0005 |
| 2020/0333380 A1* | 10/2020 | Vuillermet | ......... | G01R 19/0038 |

* cited by examiner

*Primary Examiner* — Tung X Nguyen
*Assistant Examiner* — Robert P Alejnikov, Jr.

(57) ABSTRACT

A low-noise alternating current sensor enables low-cost, large dynamic range current measurements of low-frequency alternating current flows. The low-noise current sensor offers enhanced dynamic range and fine-grained sensitivity unavailable in existing sensor technology. The sensor's dynamic range and sensitivity to low-frequency AC enable new capabilities in precision current control: a valuable and necessary capability in the control and management of circuit considerations, from applications for the grid to transportation, to the control of remote assets.

20 Claims, 13 Drawing Sheets

LOW-NOISE, LARGE DYNAMIC-RANGE SENSOR FOR MEASURING CURRENT

CROSS-REFERENCE TO RELATED APPLICATION

This application claims the benefit of Provisional application No. 62/929,657, filed Nov. 1, 2019, the contents of which are incorporated herein by reference in their entirety.

BACKGROUND

With the advances in wired and wireless networks enabling the "Internet of Things," it becomes clear that remote management would benefit from sensitive and accurate monitoring of current flow.

Advances in AC waveform analytics and embedded microcomputers have led to real-time in-depth circuit analyses, including electric motor management and precise power control. It is possible to use waveform analytics to estimate instantaneous power draw; and from the measurement of power consumption, real-world activity can be inferred more accurately than from other measures. For example, accurately sensing the first few cycles of an alternating current motor at start up will yield significantly more information when coupled with accelerometer data than the accelerometer data can yield by itself.

Accurate current waveforms and accelerometer data will directly yield data concerning gear trains, road conditions, inclines, gross vehicle mass and even details about a motor's physical condition and maintenance needs. These measurements can be collected and refined as historical models to become another layer of analytical tools which can be used for control, and to infer both maintenance and operational variances from expected norms.

Measuring low-frequency AC electrical current in a conductor is usually performed by exploiting one of two well known relationships associated with current flow. The first relationship is known as Ohm's Law and it relates voltage and current to a known resistance. One type of current sensor that uses Ohm's law to measure current is called a current shunt or a shunt current sensor. The voltage is measured across a known resistance: using the measured voltage as the dividend, the known resistance as the divisor, the value of the current as an RMS (Root Mean Square) quantity is the quotient. This method is problematic when high currents are measured, as even minimal calibrated resistances will convert power to heat by the current squared multiplied by the resistance ($I^2R$) relationship, which can be significant and represents a loss of efficiency.

The second well known relationship for measuring low-frequency AC current is Faraday's Law. Faraday's Law states that a time-varying AC current flowing in a conductor causes a perfectly orthogonal flux emission of a magnetic wave which is proportional to the magnitude of current flow. The time-varying flux causes an induced voltage in a closed loop of wire that is cut by the flux. Capturing a representative measure of the flux emission can be accomplished using a suitably constructed cut loop (an antenna) terminated in a matching impedance. The complicating issues are arranging the antenna to be perfectly orthogonal and limiting the received magnetic emission to be the one intended to be captured.

Another, more recently discovered, relationship associated with current flow that offers a method of measurement is known as the Hall Effect. The Hall Effect is something of the same phenomena expressed as Faraday's Law, but this time the effect of the current flow-induced flux is measured within the conductor itself. The flow of current in a conductor causes a magnetic flux orthogonal to the flow of the current. The magnetic flux pushes the negatively charged electrons to one side of the conductor. The pressure of this push is directly related to the magnitude of the current flow. The resulting electric potential across the conductor at right angles to the flow of the current is measured as a voltage that accurately reflects the magnitude of the current flow. But as the current flows get larger, the small changes in the magnitude of the current flow result in very small changes in electric potential across the flow, which become indistinguishable from current-induced noise.

Hall Effect mechanisms enabling large current measurements make the simultaneous measurements of small currents difficult. Thus, measuring large dynamic ranges, which would enable large amplitudes to be measured with very high resolution, is difficult using Hall Effect mechanisms. The need for efficient, accurate and sensitive current sensors is not met by available sensors, including Hall Effect and discrete current loop sensors. Such devices lack dynamic range. This means that if the devices are configured to measure very small currents, they cannot measure large ones. And if configured to measure large currents, they cannot resolve small ones.

The need for large dynamic range providing the simultaneous features of measuring large amplitudes with high resolution is problematic. One of the significant factors at play compounding the problem of a high resolution and large signal range is circuit noise composed of thermal noise and a combination of magnetic and electric field noise. As current amplitudes get larger within a circuit, coupling from one circuit path to another by radiated energy combined with $I^2R$ effects can render high resolution difficult to obtain.

Furthermore, the problems are exacerbated when attempting to measure high-current circuits using physically small sensors. Physically small Hall Effect sensors have limited maximum current capabilities and they also offer limited dynamic range. Physically small discrete current loops are very difficult to productize because of a lack of defined physical interface structures capable of carrying large currents.

Accurately measuring small differences in the magnitude of separate current flows is a challenge that cannot be overcome by conventional Hall Effect devices because of their limited dynamic range and inability to handle large currents. Current loops are also challenged to provide high resolution accurate measurement of large current flows because the radiated electromagnetic and electric field noise from nearby large current flows is seen as circuit noise that masks the fine-resolution signals.

Additionally, in the typical application of existing technology, the high resolution of large current flows using discrete components or wire is difficult because physically locating the loop sensor so as to be perfectly orthogonal and concentric to the flux path is beyond current manual or automated technologies. The challenge is the asymmetry of placement of the wires in the current loop field.

A special challenge for current loops lies in the high resolution of difference currents between two AC conductors, one the supply and one the return. Current Ground Fault Interrupter technologies implement simultaneous counter-windings around a common movable core that trips a circuit switch to open upon a detectable current level. The physical complexity and comparatively large size of simultaneous windings as an alternative limits their use in low-cost, large-volume, high-current circuit applications demanding accurate high-resolution current-sensing capabilities.

BRIEF SUMMARY

Embodiments of the present disclosure include a Low-Noise, Low-Frequency, Alternating Current Sensor which applies Faraday shielding and physical radiation-noise canceling as an implementation of a planar current loop sensor disposed on a plurality of stacked substrates.

Characteristics that are present in embodiments include precise orthogonal sensor placement relative to current-induced flux path, precise concentric placement of the flux concentrator relative to the target current conductor, the minimization of radiated flux from the current transport conductors into and out of the target current conductor relative to the flux concentrator using minimizing corner geometries, the minimization of thermal dissipation by using optimized skin effect transport conductor design and the reduction of the reception of radiated noise through the use of a nearly full-circumferential, multilayered circuit card-implemented Faraday shielding construction. Significant reduction of noise-radiated coupling within the circuit is achieved with separately grounded Faraday shield radiation barriers to segregate high-current conductors from the associated low signal-amplitude loop sensor conductors.

In an embodiment, a current sensor comprises a plurality of substrates, a first conductive path, a flux path comprising a first portion orthogonal to the first conductive path and a second portion, each of the first and second portions penetrating the plurality of substrates, an inductive sensor with a first loop oriented orthogonal to the second portion of the magnetic flux path, an amplifier coupled to the inductive sensor, and a Faraday cage disposed between the first portion and the second portion of the flux path.

BRIEF DESCRIPTION OF THE FIGURES

The accompanying drawings are intended to convey the concept and are not intended as blueprints for construction as they are not drawn to scale: the drawings are typically exaggerated to show features that would otherwise be obscured. However, the foregoing aspects and many of the attendant advantages of the technologies described by this disclosure will become more readily appreciated by reference to the following detailed descriptions, when taken in conjunction with the accompanying drawings, wherein.

DETAILED DESCRIPTION

Figure 1:
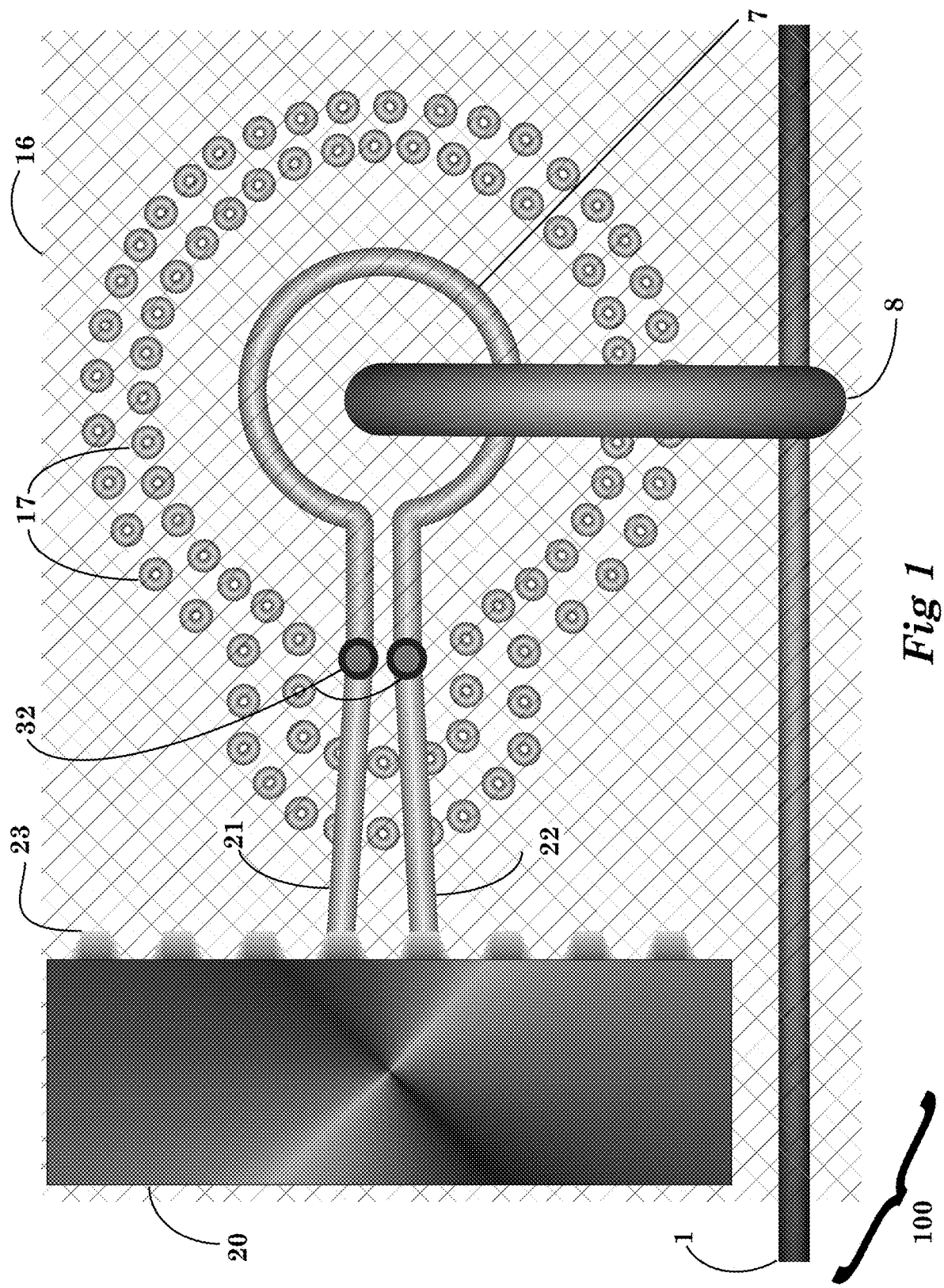
FIG. 1 shows a plan view of an inductive loop-sensing current magnitude-detecting planar sensor including a complete Faraday cage that isolates the flux-detecting loop from radiated energy emitted from sources outside of the Faraday cage while the loop is shown coupled to an isolation, differential instrumentation amplifier as an integrated circuit or a Chip-On-Board (COB) device.

The following list provides a number of specific descriptions and examples of components that are present in the embodiments illustrated by the figures. The descriptions in the list are illustrative of specific embodiments, and should not be construed as limiting the scope of this disclosure.

| Reference Numerals | Description |
|---|---|
| 1 | AC conductor representing one connection component (supply or return) of a circuit in which current is to be measured. |
| 2 | AC conductor representing one connection component (supply or return) of a circuit in which current is to be measured. |
| 3 | Surface substrate on which components could be mounted on the top or bottom side and a ground plane 31 is plated on the opposite side. |
| 4 | Substrate supporting a high-current conductor 1 disposed on the top side. |
| 5 | Substrate on which an inductive sensor 7, is plated on the top side and shielded on the bottom side by a ground plane 31. |
| 6 | Substrate supporting a high-current conductor 2 plated in heavy copper and disposed on the bottom side, with a Faraday cage pass-through terminating on the ground plane 31 on the top side. |
| 7 | Inductive sensor conductor orthogonal to the flux-conducting orthogonal path 8. |
| 8 | Flux-conducting orthogonal path. |
| 9 | Exposed circuit card substrate. |
| 10 | A terminating "turn" section of a multi-turn inductive sensor orthogonal to flux-conducting orthogonal path 8. |
| 11 | A non-terminating "turn" section of a multi-turn inductive sensor orthogonal to flux-conducting orthogonal path 8. |
| 12 | A complementary terminating "turn" section of a multi-turn inductive sensor orthogonal to flux-conducting orthogonal path 8. |
| 13 | A vertical drilled and plated-through via connecting return circuit 22 with a terminating horizontal "turn" of an inductive sensor. |
| 14 | A vertical drilled and plated-through via connecting successive horizontal "turns" or turn components 10, 11, 12 of an inductive sensor. |
| 15 | A Faraday cage |
| 16 | Insulation layer |
| 17 | A via created to form vertical "cage" components of a Faraday cage 15 isolating an inductive sensor. |
| 18 | An isolation gap between a Faraday cage and an intermediate circuit board layer on which other circuit components may be located. |
| 20 | A Chip-On-Board (COB) or Integrated Circuit (IC) differential instrumentation amplifier. |
| 21 | A first conductive element or terminal arm connecting a current loop sensor to a differential instrumentation amplifier 20. |
| 22 | A second conductive element or terminal arm that is a return or companion circuit element to the first conductive element 21. |
| 23 | COB or IC differential, instrumentation amplifier terminating contact. |
| 31 | Ground plane on one layer of circuit board. |
| 32 | Vertical via (13, 14) transition to connective circuit components 21 and 22. |
| 100 | Current sensor |

Embodiments of the present disclosure are directed towards a large dynamic-range inductive current sensor 100. The technology includes the procedure for creating an inductive sensor of nominal sensitivity, which includes an orthogonal inductive sensor 7, precisely placed around a high-permeability flux-conducting path component 8 that is orthogonal to a current-carrying conductor 1 (see FIG. 3) and embodiments in which turns of an inductive sensor 7 are disposed on several different substrates (see FIG. 4) for greater sensitivity.

The present disclosure describes embodiments that have at least two applications. The first application, an embodiment of which is shown in FIG. 1, is the measurement of the magnitude of currents with very high resolution, and can be applied to relatively high current flows as a current sensor 100 with larger dynamic range than conventional sensors. The second application is precise measurement of a difference in current between a supply and a return conductor. Embodiments of a difference sensing current sensor are shown in FIGS. 6, 7, 9 and 11.

Figure 5:
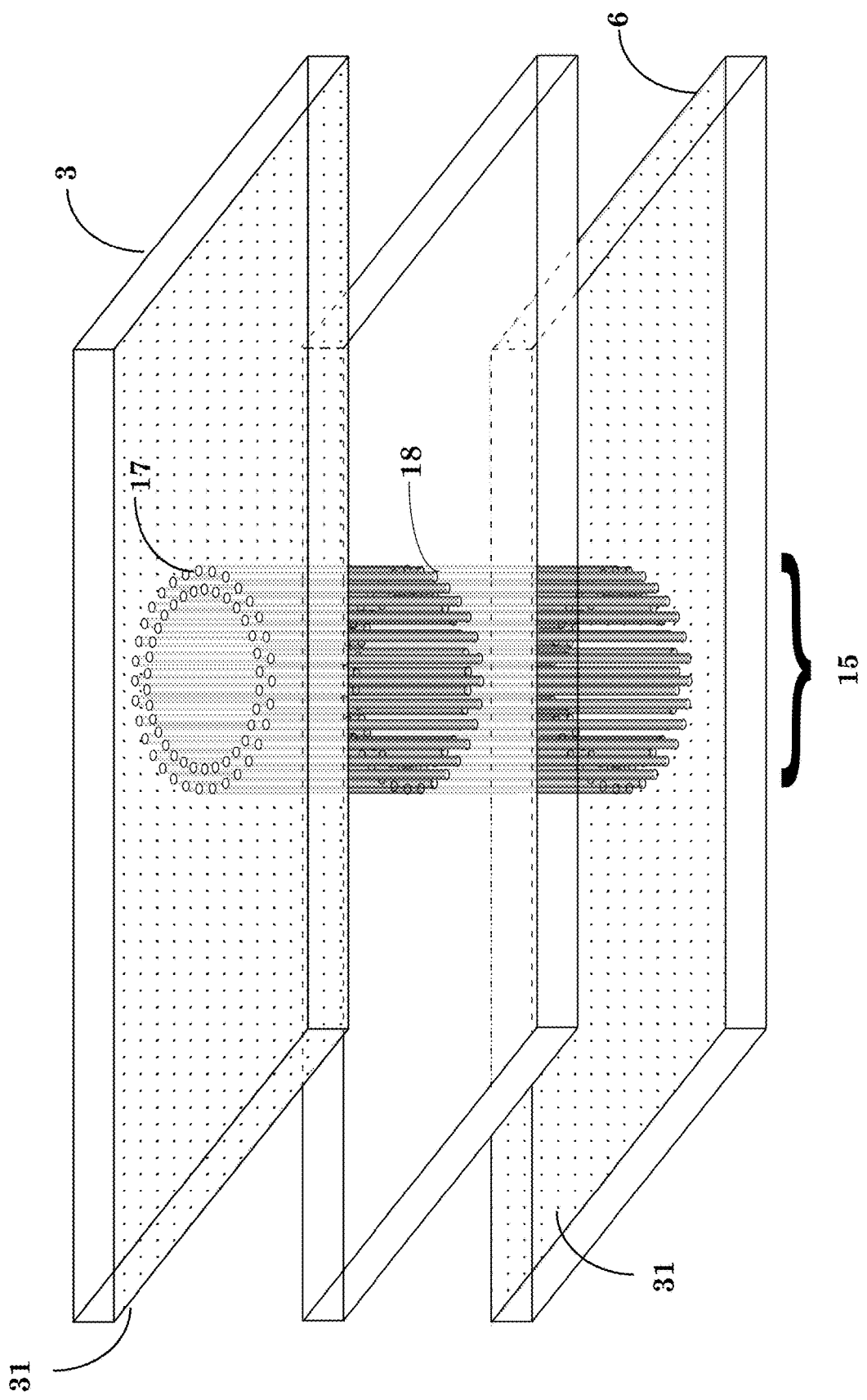
FIG. 5 shows a view of the inner construction of planar interconnected ground planes using drilled and plated-through vias to create a Faraday isolation cage.
Figure 8:
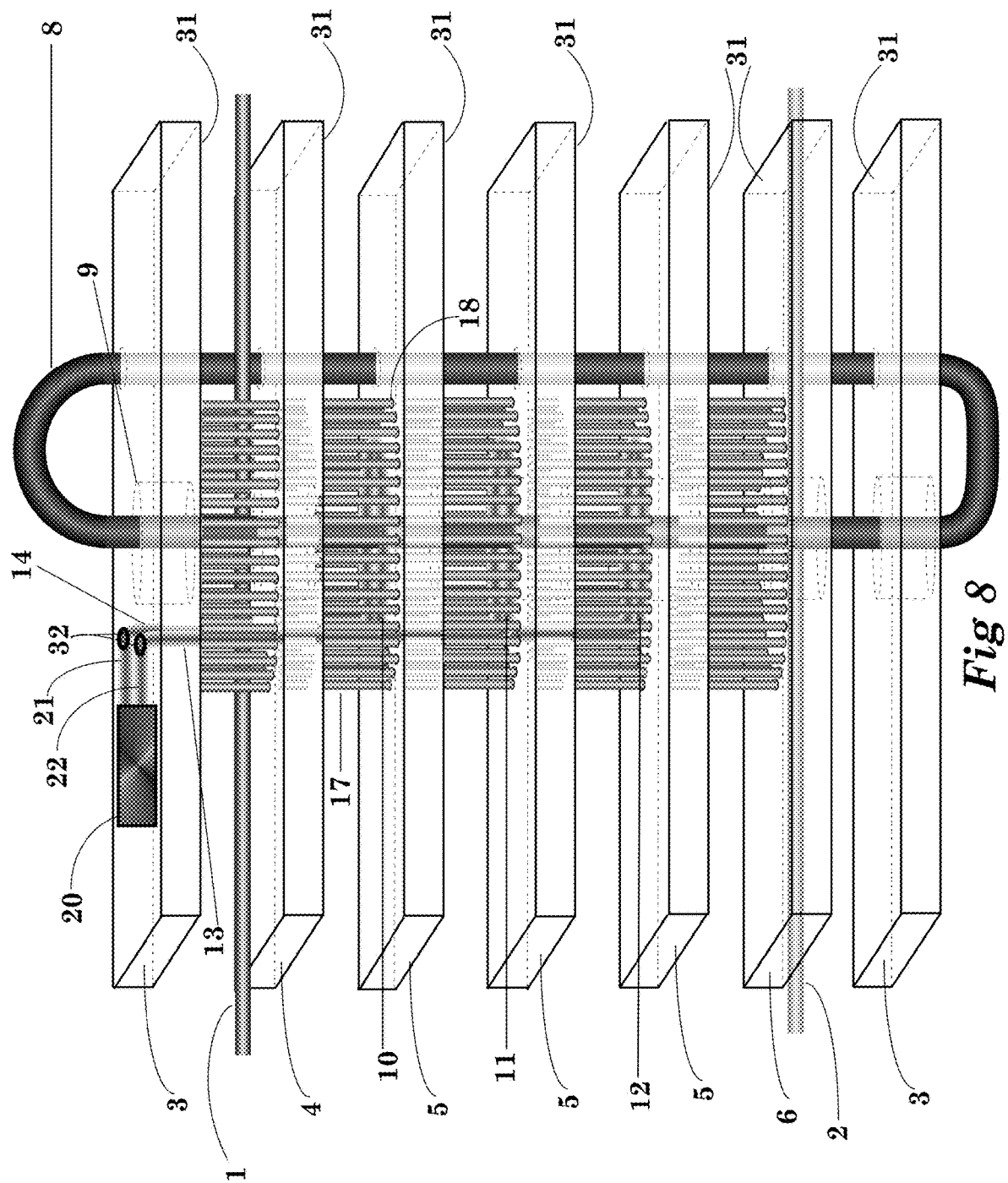
FIG. 8 shows a side view of the planar circuit presented in FIG. 7.

Embodiments of the present disclosure use the precision capabilities of multilayer photo-resist printed circuit board construction, along with the macro design considerations of Faraday electromagnetic and electric field isolation theory. These technologies can be combined to create a 3-dimensional physical construction (FIGS. 2 and 8) that implements a Faraday cage 15 (FIG. 5), blocking outside radiation, as well as implementing an architecture of planar component structures to affect the reduction of magnetic, electric field and thermally induced self-noise inside the cage. The constructed Faraday cage 15 provides electromagnetic and electric field isolation around one or more of the loops of an inductive loop sensor 7 using ground planes terminating or supporting a "cage" of drilled, plated-through and filled vias positioned appropriately around the sensor, forming an extensive electromagnetic, electric field and thermal energy dissipative structure. Further, the capabilities of current photo-resist circuit card technologies provide a significant improvement over both automated and manual component placement technologies to optimize intentional flux coupling.

Figure 3:
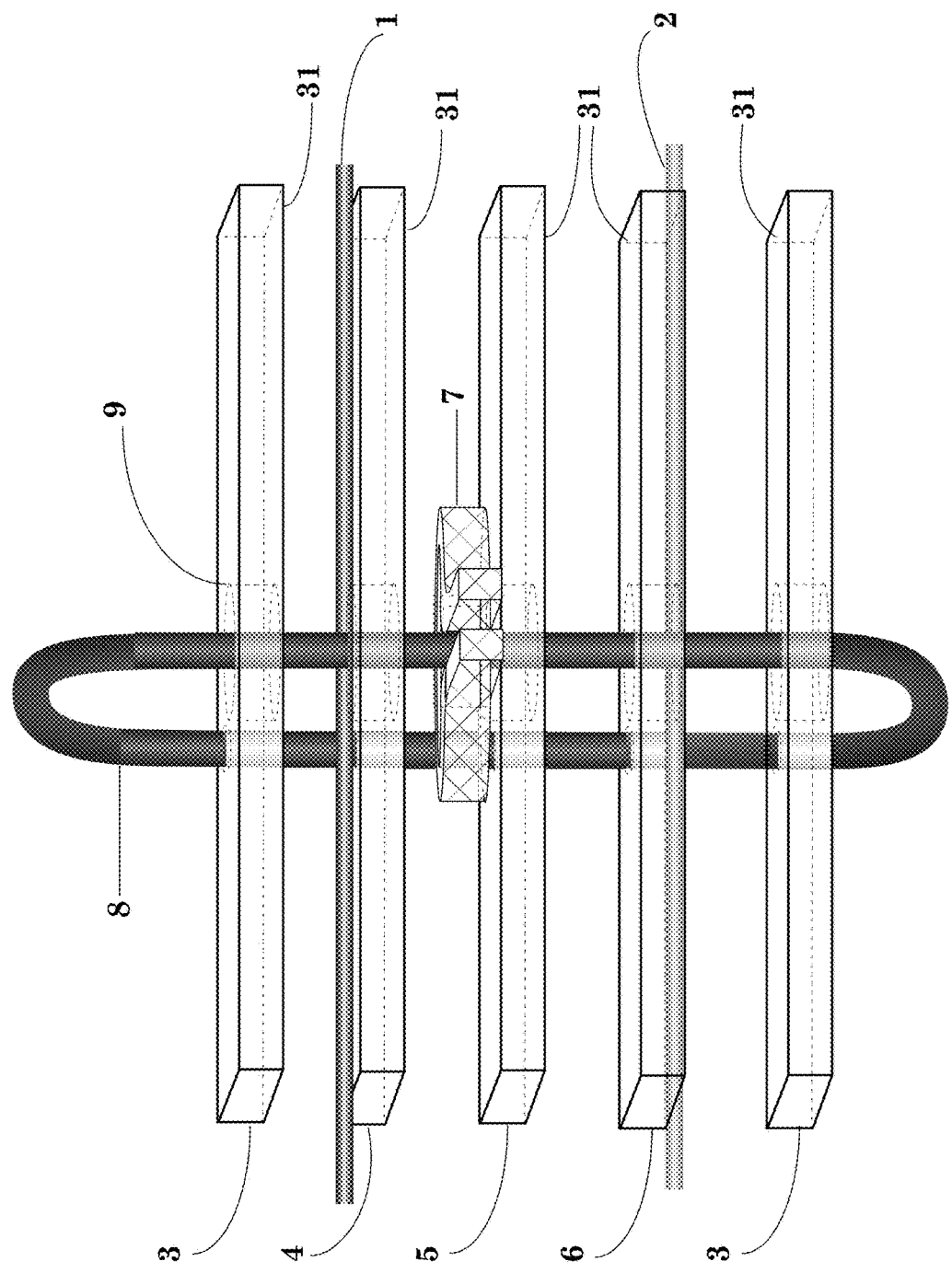
FIG. 3 illustrates a cut-away view of a core planar inductive loop-sensing current difference-detecting circuit constructed using a multilayer circuit card providing isolating ground planes above and below the circuit conductors while providing a single sensor winding around the flux-carrying ferrite core.
Figure 6:
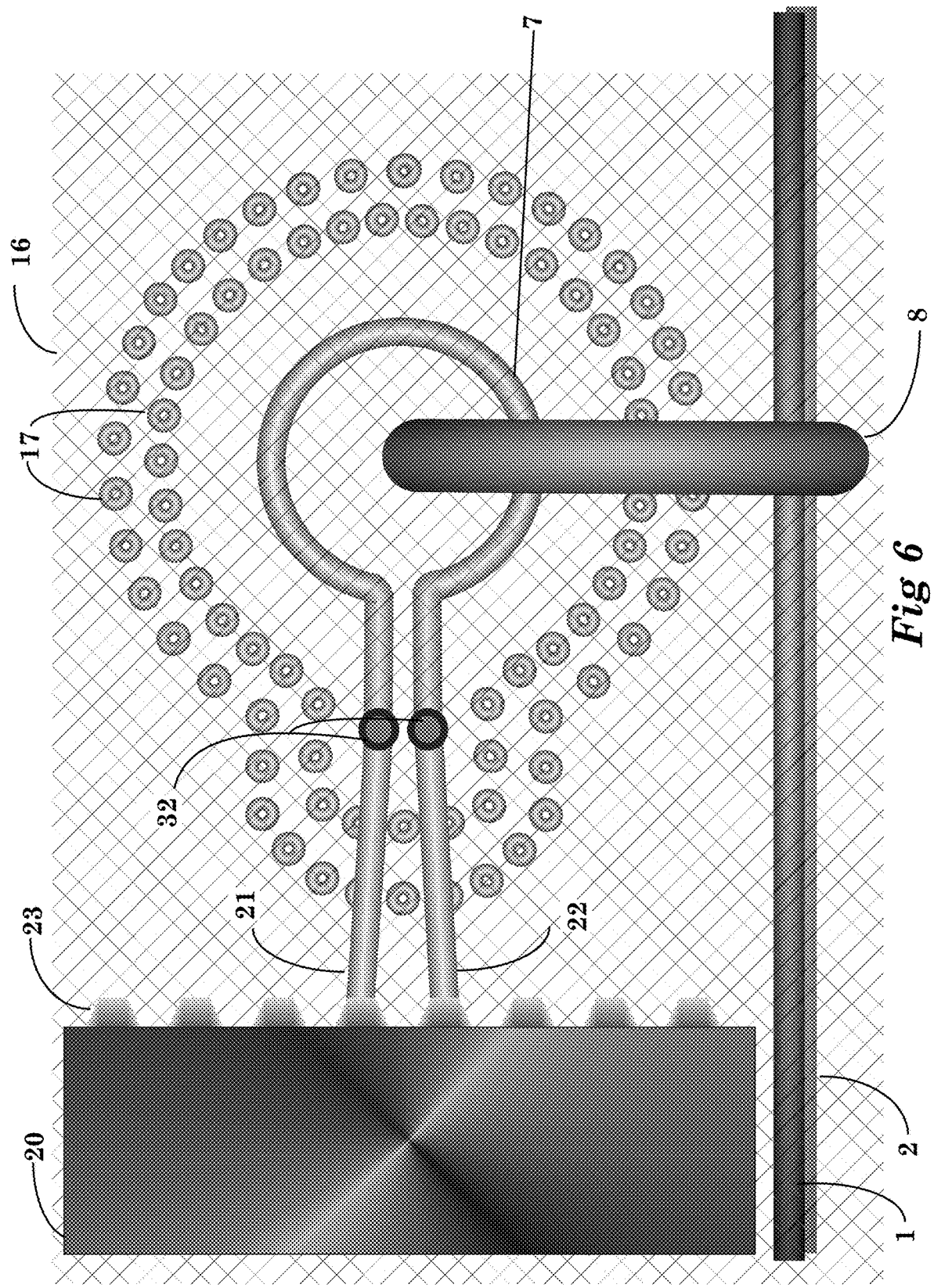
FIG. 6 shows a plan view of an inductive loop-sensing current difference-detecting planar sensor constructed using an implementation of a complete Faraday cage that isolates the flux-detecting loop from radiated energy emitted from sources outside of the Faraday cage while the loop is shown coupled to an isolation, differential instrumentation amplifier as an integrated circuit or a Chip-On-Board (COB) device.

FIG. 1 and FIG. 6 reveal plan views of the via-constructed Faraday cage 15 and planar current loop sensor 7. The vias 17 are shown but the ground planes as well as the circuit surfaces of inner layers 4, 5 and 6 of FIG. 3 are rendered transparent. Although the insulation layer 16 between the planes is only shown in FIG. 4, the insulation layer 16 may be present between every set of adjacent substrates. In an embodiment, the insulation layer 16 comprises an epoxy material, but other materials are possible. For example, the insulation layer 16 may comprise a polymer material that adheres to the substrates, and the layer may provide structural integrity as well as electrical isolation between components.

Although not shown in the figures, the circuit card substrate 9 may include copper traces and various circuit components, and a dielectric-matched epoxy binder 16 may be disposed between adjacent substrates to provide electrical isolation between conductors 1 and 2, flux-conducting orthogonal path 8 and ground planes 31. In an embodiment, the circuit card substrate 9 is a polyimide substrate. The material of the insulation layer 16 may have a dielectric constant that matches the dielectric constant of the parent circuit substrate 9.

As can be seen in FIG. 1, the high resolution construction and placement of the inductive sensor 7 and conductor 1 and flux-conducting orthogonal path 8 enable a precision placement into a concentric flux emission-capture relationship, enabling the amplitude measurement of large currents. In FIG. 1, conductor 1 is disposed towards an outer edge of the substrate 9 and is orthogonal to a portion of the flux-conducting orthogonal path 8 that extends through the circuit layers.

Figure 2:
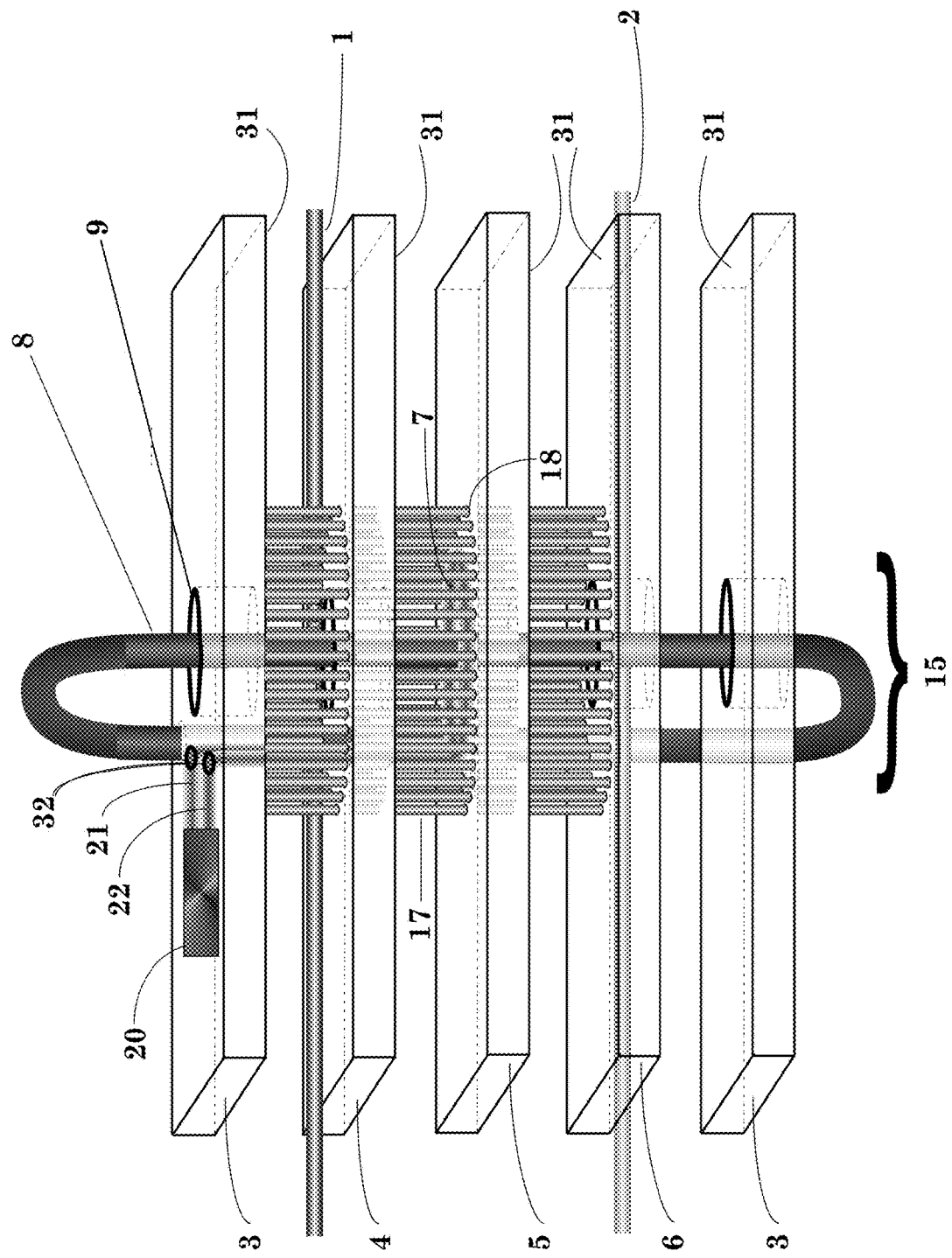
FIG. 2 shows a side view of an inductive loop-sensing current difference-detecting planar sensor constructed using an implementation of a complete Faraday cage that isolates the flux-detecting loop from radiated energy emitted from sources outside of the Faraday cage while the loop is shown coupled to an isolation, differential instrumentation amplifier as an integrated circuit or a Chip-On-Board (COB) device.

Some embodiments of the present disclosure are directed to a difference current sensor. For example, the embodiments shown in FIG. 6 and FIG. 4, conductors 1 and 2 are both oriented orthogonal to the flux-conducting orthogonal path 8 and at a different elevation than the connective components of inductive sensor 7 or the extension circuit connections 21 and 22. One or both of conductors 1 and 2 may be above or below segments of the Faraday cage 15. For example, FIG. 2 shows an embodiment in which second conductor 2 is disposed below the Faraday cage 15. In FIG. 6 the current loop sensor 7 is shown on an internal layer with vertical riser vias 32 connecting the embedded loop sensor 7 to the circuit layer connective circuit components 21 and 22, which extend the connection of the loop sensor 7 to the COB or IC differential instrumentation amplifier 20.

When the current sensor 100 is a difference current sensor, first conductor 1 may be coupled to a supply line and second conductor 2 may be coupled to a return line so that supply and return currents of an external device run through the conductors. The current running through first conductor 1 causes a first electromotive force that induces a magnetic flux in flux-conducting orthogonal path 8 in a first direction, and second conductor 2 causes a second electromotive force that induces a magnetic flux in flux-conducting orthogonal path 8 in a second direction opposite to the first direction. Equal components of opposing electromotive forces effectively cancel one another out, so that when current is evenly balanced between the first and second conductors 1 and 2, no magnetic flux flows through flux-conducting orthogonal path 8.

On the other hand, when an electrical fault such as a short or ground fault occurs in the electrical path of the first and second conductors 1 and 2, the supply and return currents are no longer balanced. In this case, the electromotive forces acting on the flux-conducting orthogonal path 8 do not cancel each other out, and the greater force of the two conductors will cause a difference flux to flow through flux-conducting orthogonal path 8. This difference flux is sensed by inductive sensor 7. Due to the sensitivity of the current sensor 100, relatively small differences in current can be sensed quickly and accurately. For example, when current on the order of 5-50 amps flows through the first and second conductors, embodiments described by the present disclosure can sense a difference as low as 2-3 mA, or 4 orders of magnitude lower than the current flowing through the conductors. Embodiments of the present disclosure can be scaled to sense currents outside this range—for example, MEMS scale devices could accurately sense currents in the milliamp range, and larger scale devices could accurately sense currents above 50 amps. In such embodiments, the current sensor 100 may sense differences or fluctuations of 3 or 4 orders of magnitude lower than the current flowing through the conductors.

When the current sensor 100 is used to sense a difference in supply and return current paths, the conductors may be positioned symmetrical to the flux-conducting orthogonal path 8. For example, FIGS. 2, 3, 4 and 8 show embodiments in which the conductors are symmetrical with respect to a horizontal plane that runs through the center of and is orthogonal to the flux-conducting orthogonal path 8. In such an embodiment, the conductors are symmetrical with respect to a length direction of a portion of the flux path.

Figure 10:
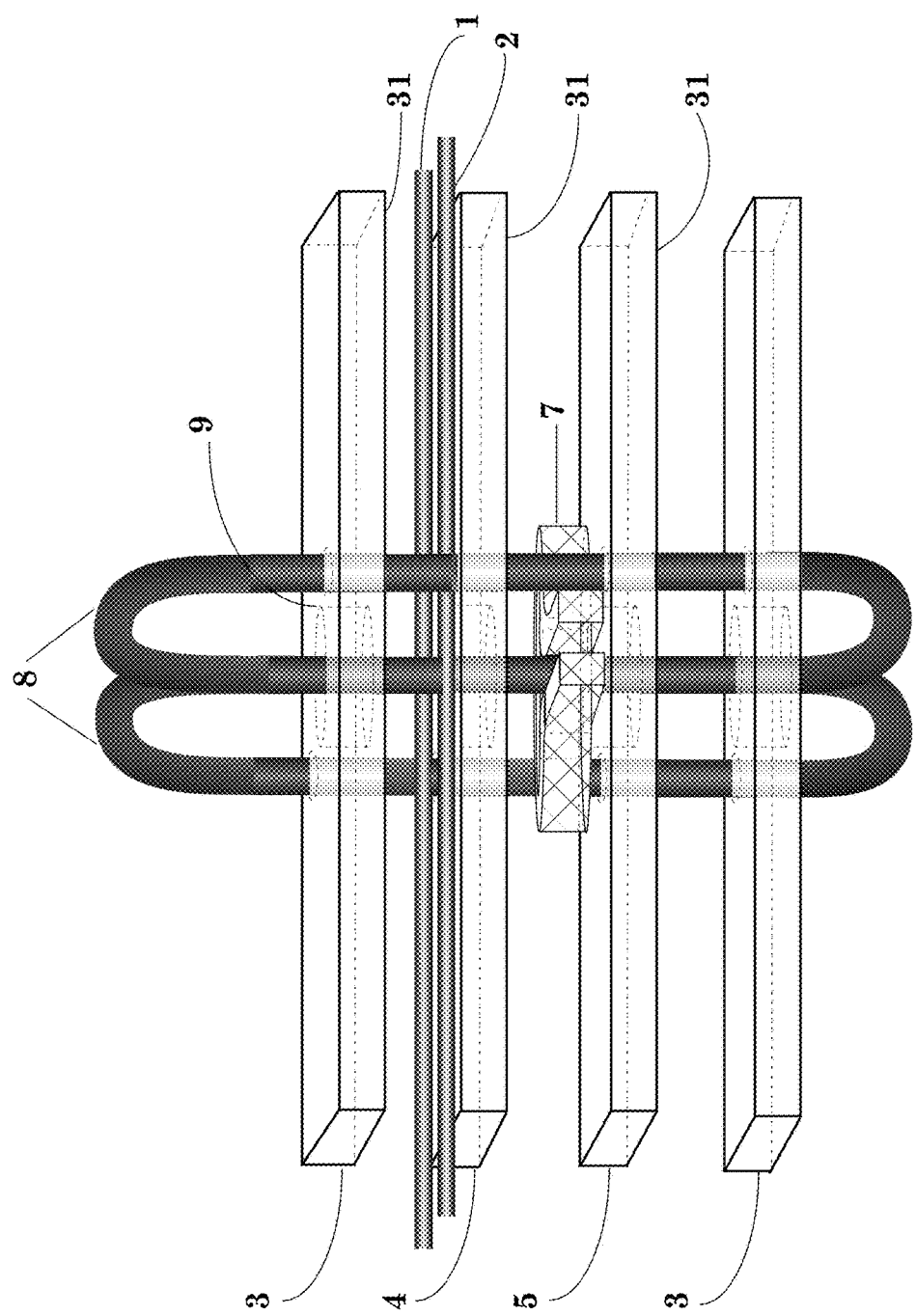
FIG. 10 shows a side view of a variation of the circuit depicted on FIGS. 6, 7 and 9, but using a 3-path, double-loop magnetic field component rather than a 2-path single-loop magnetic field component.

FIG. 10 shows an embodiment in which flux-conducting orthogonal path 8 comprises two flux-conducting loops that share a central flow path. In such an embodiment, the first and second conductors may be positioned symmetrically with respect to a horizontal direction of the flux-conducting loops 8 as seen in FIG. 10.

In an embodiment, the amplifier 20 may be coupled to circuit interruption circuitry, and the current sensor or associated interruption circuitry 100 may be configured to interrupt a circuit when a particular amount of difference current is detected. Accordingly, embodiments of the current sensor 100 may protect sensitive equipment or personnel from being damaged by ground faults or shorts in a circuit that carries current.

Furthermore, the current sensor technologies described by the present disclosure are scalable, and can be applied to a range of currents. For example, while the embodiments shown in the figures are described with respect to PCB technologies and manufacturing techniques, deposition, doping, polishing and etching techniques can be applied to fabricate an embodiment that is a micro-electromechanical system (MEMS) device.

Although the figures show conductors 1 and 2 as having round shapes for the convenience of illustration, embodiments of the conductors may have a generally flat shape in which the width of the conductors is substantially greater than the thickness of the conductors. In such an embodiment, a round conductive wire of a device through which current flow is being measured may be electrically coupled to a terminal (not shown) that is provided on the circuit board on which the conductor 1 or 2 is disposed, or on a package or assembly associated with the circuit board. In an embodiment, conventional outlet plugs can be used to couple a current sensor 100 to the electrical path of an external device. In another embodiment, the current sensor 100 is integrated into the electrical circuitry of a device through which current flow is to be measured.

Figure 7:
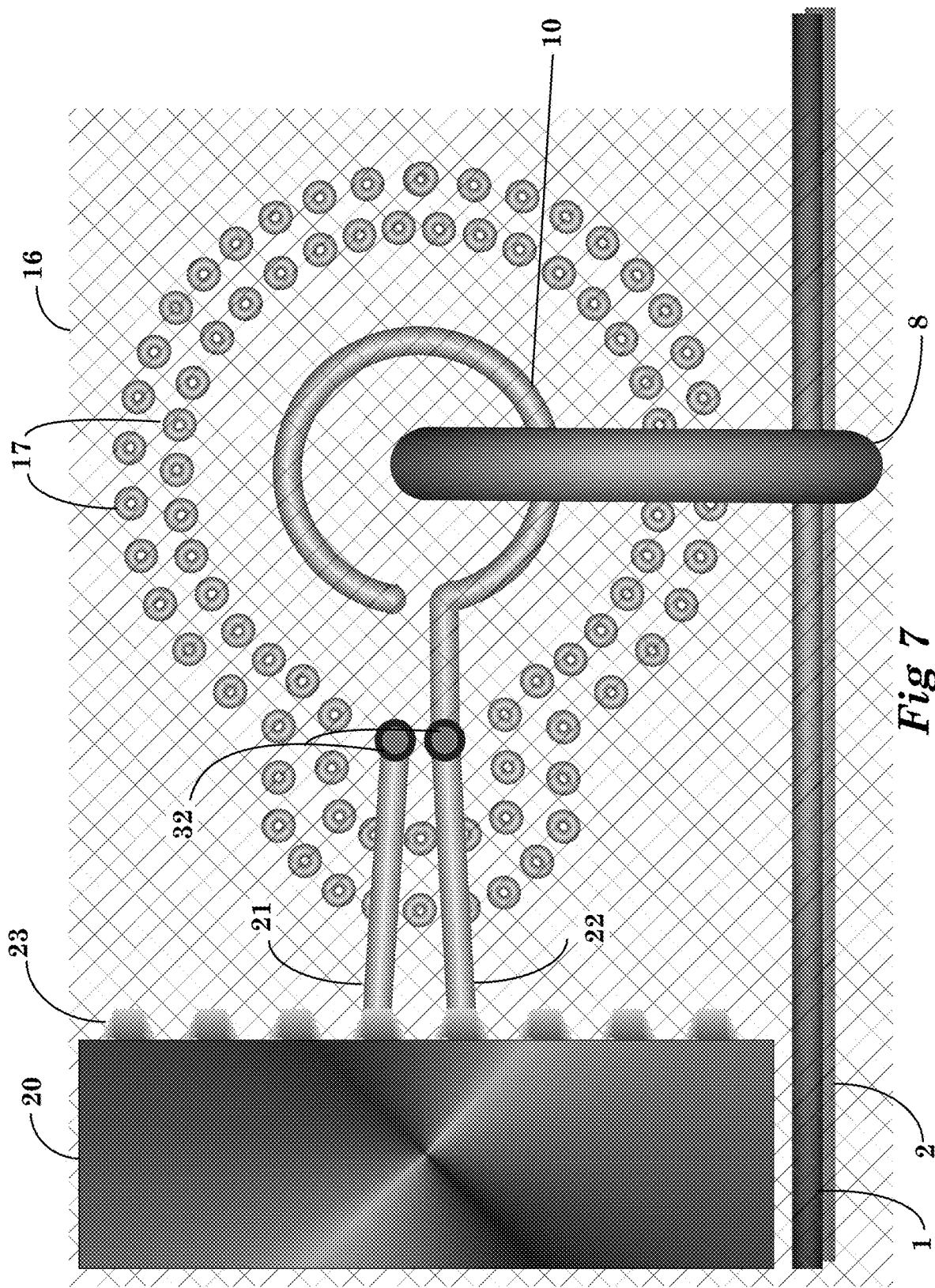
FIG. 7 shows a plan view of an inductive multi-loop sensing current difference-detecting planar sensor constructed using an implementation of a complete Faraday cage, isolating the flux-detecting loop from radiated energy emitted from sources outside of the Faraday cage while the loop is shown connected to an isolation, differential instrumentation amplifier as an integrated circuit or a Chip-On-Board (COB) device.
Figure 9:
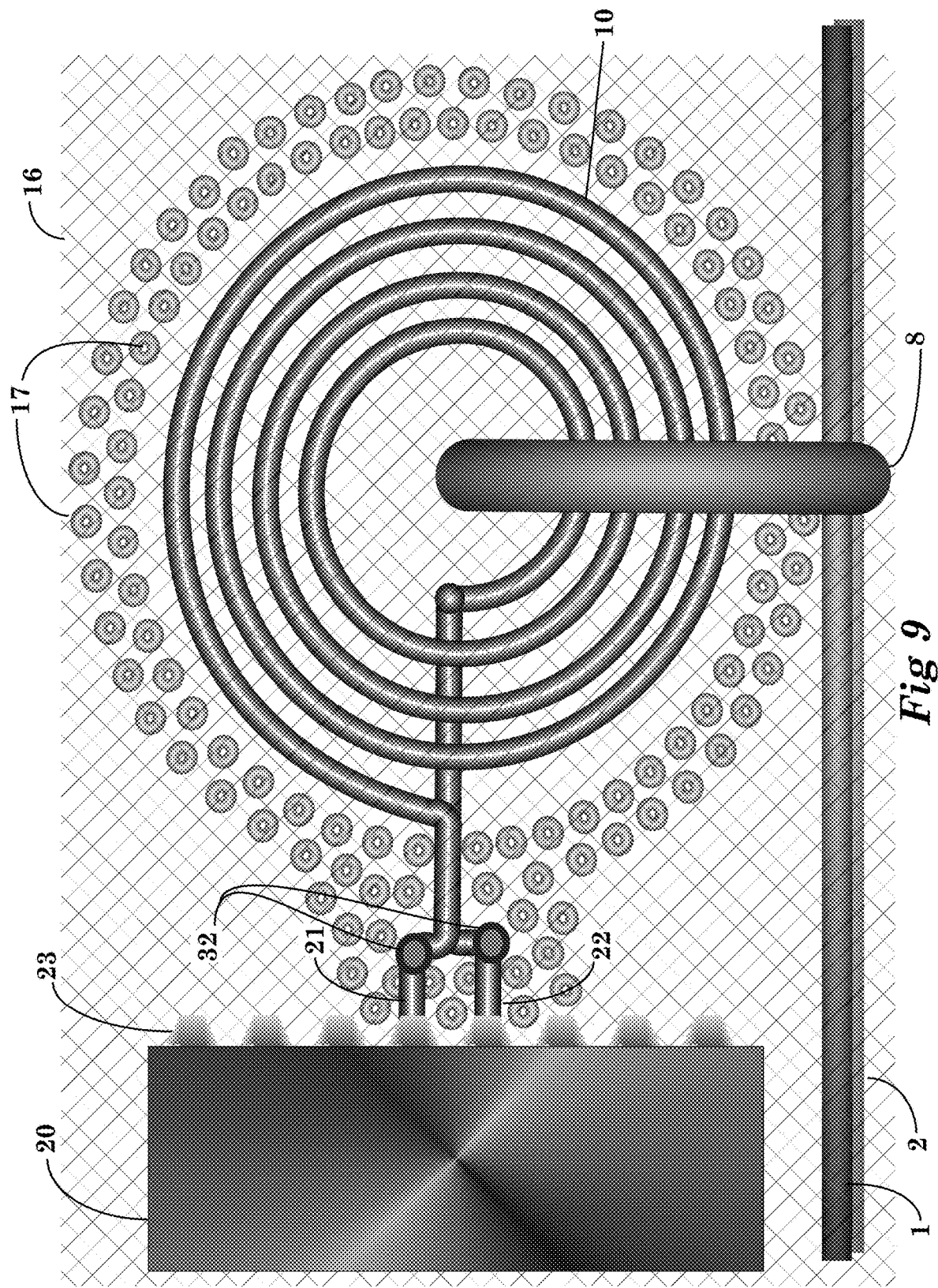
FIG. 9 shows a plan view of the sensing circuit of FIG. 6 where multiple loops are implemented on a single layer, which could be repeated on each sensor layer of the circuit depicted in FIG. 7.

Plan views in FIGS. 6, 7 and 9 show the conductors 1 and 2 as being offset from one another with respect to the circuit board plane for the convenience of illustration, so that both conductors are visible in the plan views. In an embodiment, the distance between the first conductor 1 and flux-conducting orthogonal path 8 is the same as the distance between the second conductor 2 and flux-conducting orthogonal path 8.

In some embodiments, the conductors may have a width-to-thickness ratio, or aspect ratio, of 10:1, 50:1, 100:1 or more. The precision of photo-resist printing allows the creation of conductors having a width-to-thickness ratio of greater than 100. Such conductor geometries may minimize the emission of non-uniform flux fields due to conductor corner effects. Embodiments are not limited to a specific conductor shape, but current sensing may be more accurate when the conductors lack sharp corners and have high width-to-thickness ratios. The material for conductors 1 and 2 may be a conductive material such as copper or silver.

In an embodiment, conductors 1 and 2 may comprise a superconducting material. The superconducting material may be maintained in a superconducting state by lowering the temperature of the conductors, which has an additional benefit of reducing thermal noise. At higher temperatures, superconductivity can be imparted by applying a pressure to the conductors. For example, recent advances in superconducting technology have established that superconductivity can be obtained at room temperature by applying sufficient pressure to hydrogen-rich materials. Using superconductors as the conductors 1 and 2 can improve current sensing accuracy and sensitivity.

Conductors 1 and 2 may be implemented as planar conductors having a cross-sectional area such that the specific resistance is relatively low. In an embodiment, the resistance is low enough that at the maximum-rated current flow the thermal energy dissipated by the conductor material into the circuit card does not exceed the combined conductive and convective cooling capacity of the circuit card, which would cause the temperature of the circuit card to rise.

In an embodiment, the conductors 1 and 2 are implemented as wide, thin copper conductors to minimize the magnetic effects of the current flow at the corners of the conductors, while the flux-conducting orthogonal path 8 has a cross-sectional area at least equal to 2 times the cross-sectional area of the high-current ribbon conductor. In other embodiments, the flux-conducting orthogonal path 8 has a cross-sectional area that is 5, 10 or more times the cross-sectional area of the conductors. An embodiment in which a conductor has a high width-to-thickness ratio and the flux-conducting orthogonal path 8 has a cross-sectional area that is at least twice the cross-sectional area of the conductors may minimize radiated electromagnetic noise and self-induced thermal noise.

Figures 12A, 12B:
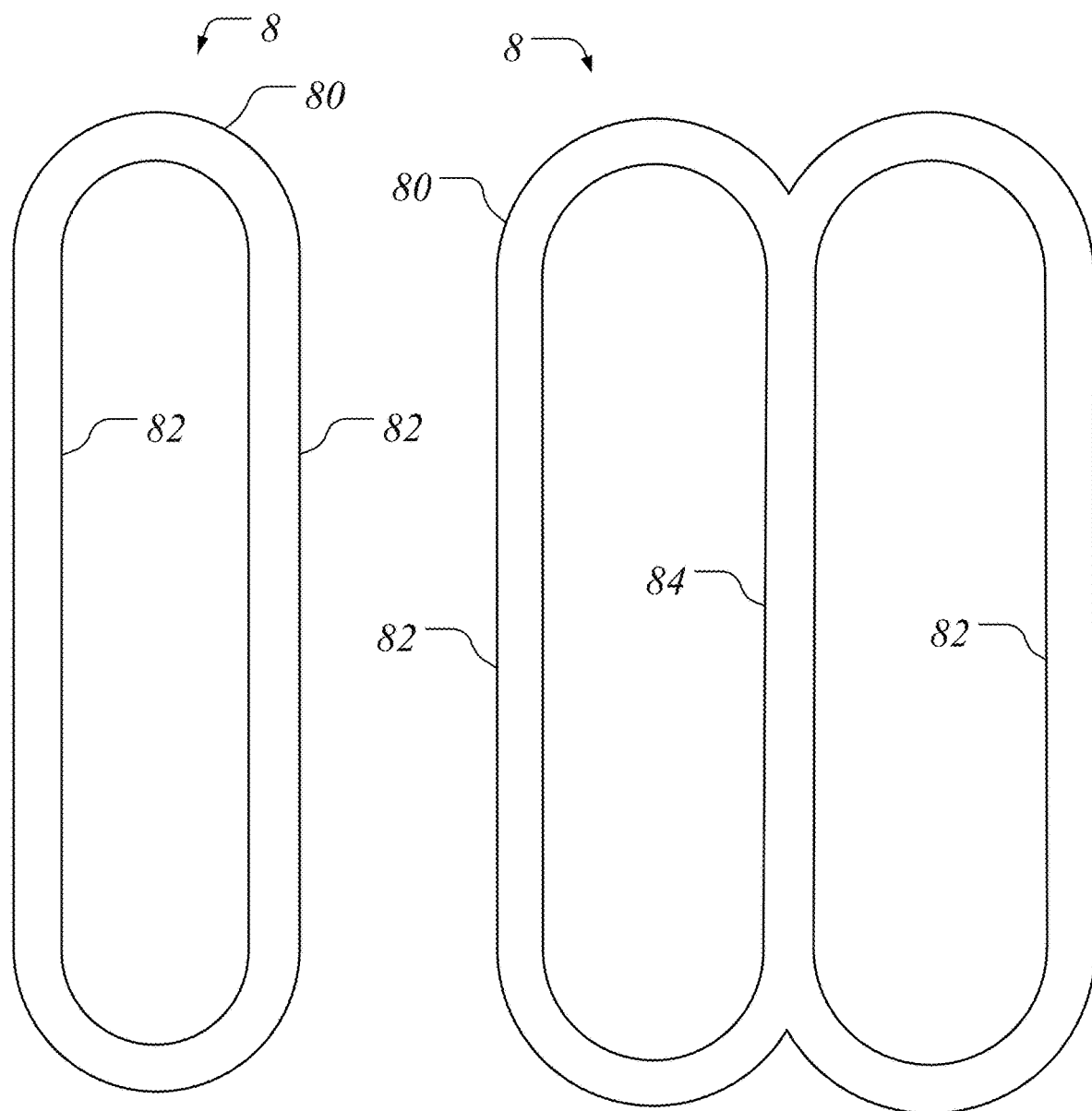
FIG. 12A shows a single-loop flux-conducting path.
FIG. 12B shows a double-loop flux-conductive path.

FIG. 12A shows an embodiment of a flux-conducting orthogonal path 8 that comprises a single loop, as seen in FIGS. 1-4 and 6-9. The embodiment shown in FIG. 12A has an oval shape comprising two connecting parts 80 that are coupled to one another through penetrating parts 82, which penetrate one or more substrate layer. The radius or precise shape of the connecting parts 80 is not particularly limited so long as they provide an effective pathway for magnetic flux between the penetrating parts 82.

Each of the connecting parts 80 may be formed separately from the penetrating parts 82 and bonded to the connecting parts in assembly. The penetrating parts 82 and the connecting parts 80 may be fabricated as discrete parts and assembled into the current sensor 100 by inserting the penetrating parts into holes disposed in one or more substrate of the current sensor, and subsequently attaching the connecting parts to the penetrating parts by, for example, a friction fit, weld, or adhesive bond. When an adhesive is used, the sizes of the components may be enlarged compared to a friction fit assembly to compensate for the resistance introduced by the adhesive interface. In another embodiment, the penetrating parts 82 may be formed by depositing a magnetic flux conducting material into holes that are laser-drilled through a plurality of stacked substrates, and the turns 80 may be formed by placing or depositing a conductive material over exposed ends of the penetrating parts 82.

Figure 11:
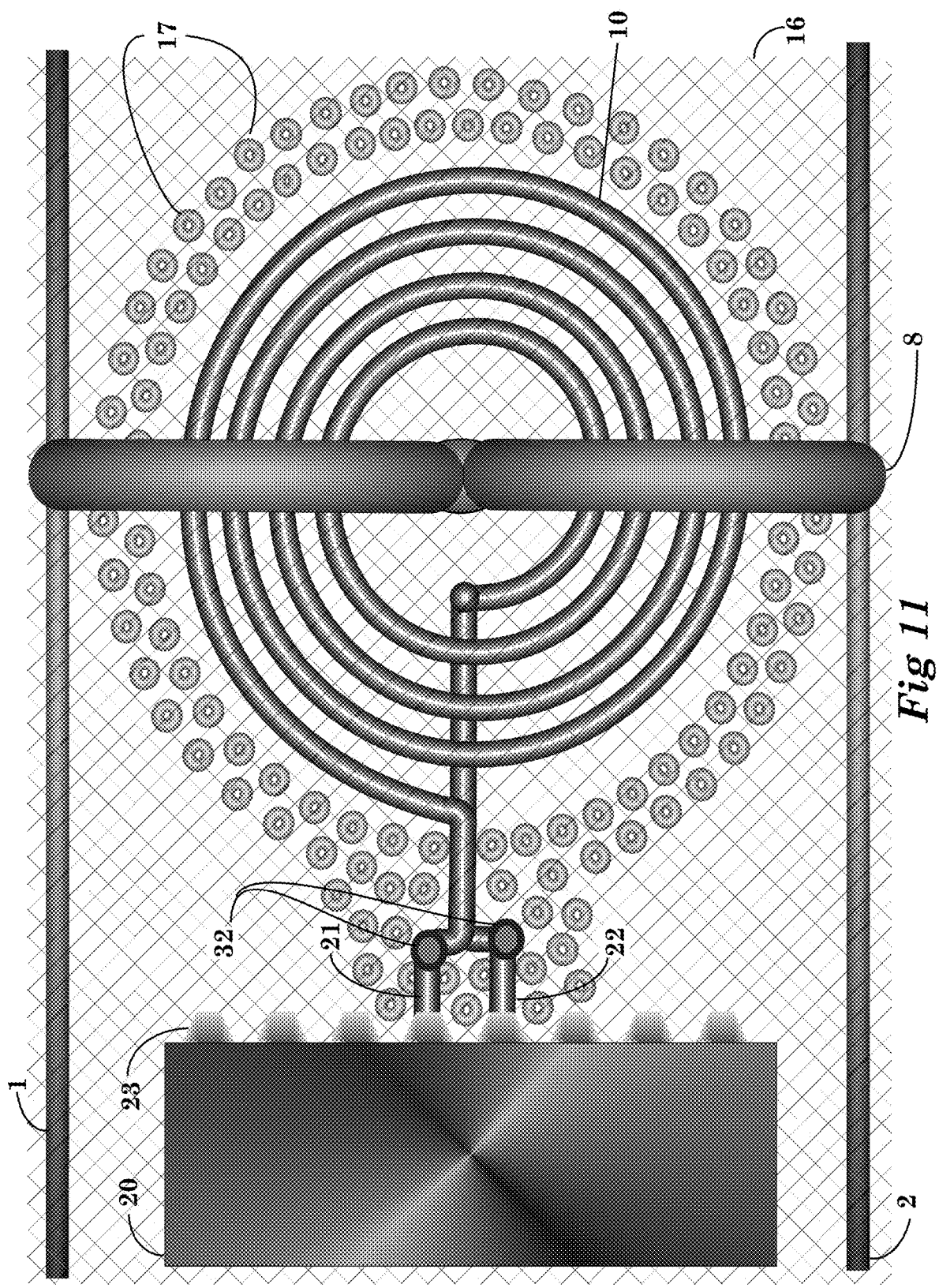
FIG. 11 shows a plan view of the circuit presented in FIG. 10, illustrating that a 3- (or more) path magnetic circuit could be used with a multi-loop, multilayer sensor implementation.

FIG. 12B shows an embodiment of a flux-conducting orthogonal path 8 that comprises two loops, as seen in FIGS. 10-11. In such an embodiment, the two loops share a central penetrating part 84 that is coupled to an inductive current sensor 7. When current flows through conductors in opposite directions and the conductors are coupled to separate penetrating parts 82, flux induced by the conductors meets in the central penetrating part 84. When the current in the conductors is equal, the opposing flux paths cancel one another out, but when the current in the conductors is different, an amount of flux will flow through the central penetrating part 84 that is proportional to the difference.

Also shown in FIG. 1 is a loop of inductive sensor 7. The loop is a semi-circular conductive structure that extends around a portion of flux-conducting orthogonal path 8. The loop is coupled to two terminals 23 of amplifier 20 through conductive elements 22 and 21, which extend from ends of the sensor 7. In an embodiment, the conductive elements 22 and 21 are conductive traces on a circuit board. The sensor 7 may be a planar conductive structure that is orthogonal to flux-conducting orthogonal path 8 so that magnetic flux through the flux-conducting orthogonal path 8 induces a current to flow through inductive sensor 7.

The amount of current flowing through sensor 7 may be substantially lower than the amount of current flowing through a conductor 1, or the difference in current between first conductor 1 and second conductor 2. Therefore, amplifier 20 is used to amplify the current from sensor 7 so that the current can be sensed accurately.

The planar sensor loop 7 may have a width-to-thickness ratio that is no greater than 10:1. In some embodiments, the planar sensor loop 7 may have a width-to-thickness ratio of 5:1, 2:1, 1:1, 1:2, 1:5, 1:10, or greater than 1:10. In some embodiments, the planar sensor loop 7 comprises one or more layer of copper material that is printed onto a circuit board. In another embodiment, the sensor loop 7 may comprise a discrete component that is placed on a circuit board, which can facilitate relatively high width-to-thickness ratios.

The way that planar sensor 7 is arranged within the current sensor 100 enhances the accurate detection of magnetic energy: the conductor of the sensor 7 will have a small flux-induced current which will create minimal magnetic or thermal self noise. Therefore, even though the sensor 7 is disposed within the Faraday cage 15, the amount of noise generated by sensor 7 has a minimal effect on the signal that is transmitted to the amplifier 20.

To enhance the accurate coupling of the current-induced magnetic flux, loops of the inductive sensor 7 may be as close to being perfectly orthogonal and concentric with the flux-conducting orthogonal path 8 as possible. The precision of current photo-resist printing technologies enables the construction of a planar inductive current sensor as a significant improvement in relative positioning over all automated or manual discrete component placement technologies currently available.

Figure 4:
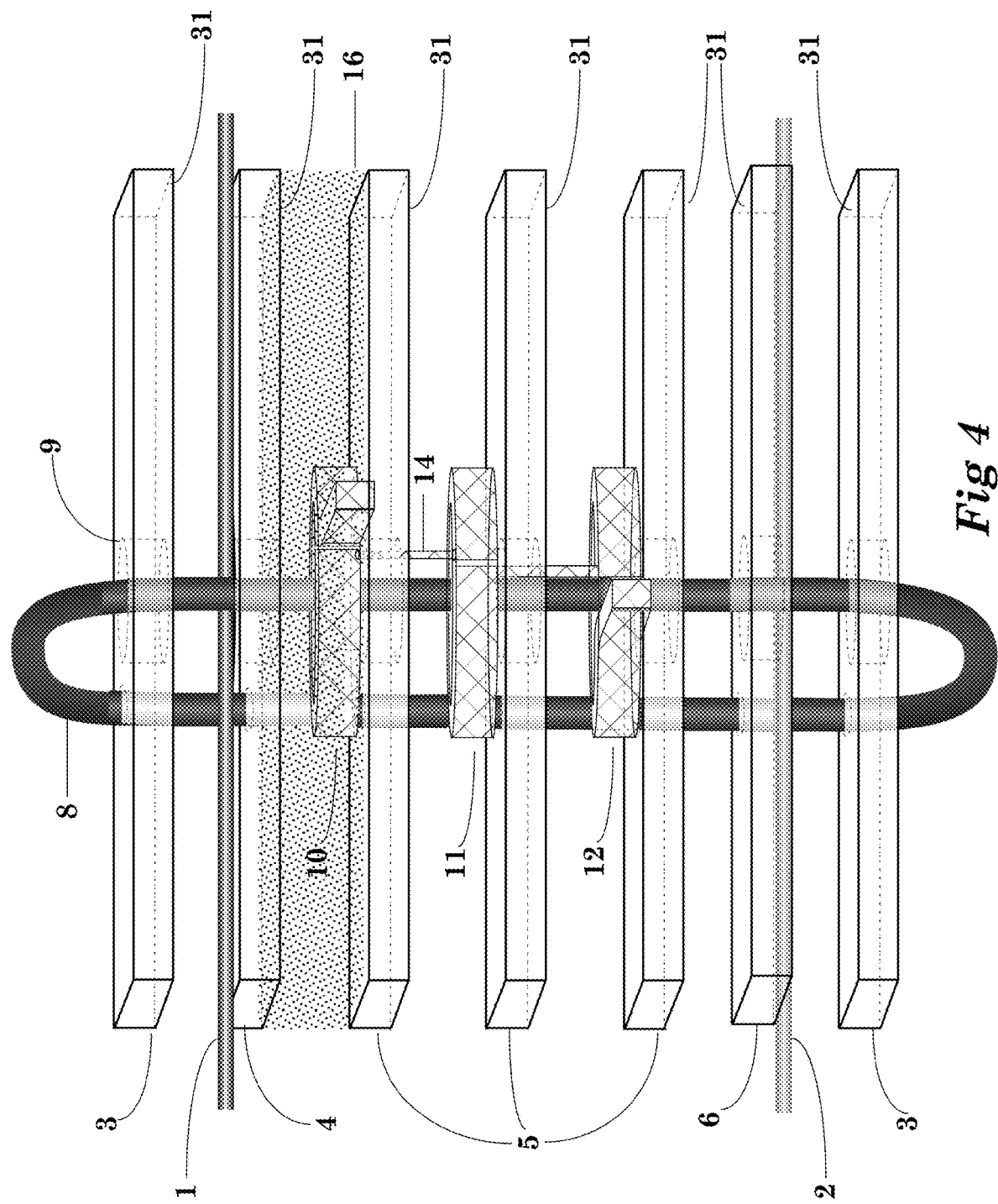
FIG. 4 illustrates a cut-away view of a core planar inductive loop-sensing current difference-detecting sensor multi-loop circuit constructed using a multilayer circuit card construction, using isolating ground planes while providing a multi-loop sensor winding around the flux-carrying ferrite core, which channels the flux of the two current-carrying conductors.

For increased sensitivity, embodiments may include a multilayer inductive sensor pickup coil or loop. For example, FIG. 4 illustrates an embodiment in which multiple planar turns of the sensor coil or loop disposed on different levels are implemented such that each turn is exactly orthogonal to the flux-conducting orthogonal path 8. Similarly, FIG. 9 shows an embodiment in which multiple loops are disposed on a single substrate. A multi-turn, multilayer inductive sensor coil can significantly improve flux coupling and minimize the cross coupling of flux energy when all of the sensor coils or loops are similarly orthogonal to the flux-conducting orthogonal path 8.

Precisely aligning multiple loops on multiple layers is difficult to implement using discrete physical components or wire. Therefore, embodiments of the present application may use photolithographic techniques to form the conductive loops, or use photolithographic techniques to provide a precisely located trench in which discrete loop elements are placed.

Multiple embodiments of the inductive sensor 7 are possible. For example, FIG. 3 illustrates an embodiment in which the inductive sensor comprises a single turn section and is disposed on only one substrate of a current sensor. FIG. 4 illustrates an embodiment in which inductive sensor 7 comprises a plurality of turn sections 10, 11 and 12 disposed on different substrates.

Although three turns are shown in FIG. 4, embodiments may comprise two turns, five turns, or even a hundred or more turns. Each turn of the inductive sensor 7 increases the amount of current that is induced in the inductive sensor by magnetic flux flowing through the flux-conducting orthogonal path 8, so providing additional turns can increase the sensitivity of the current sensor 100. Furthermore, practical considerations in plating techniques may limit the thickness to which a given turn can be formed, and such limitations can be addressed by providing multiple turns on different substrate layers.

When multiple turns are disposed on different substrate layers, those turns may be electrically coupled to one another through vertical conductive paths 14. The vertical conductive paths 14 may be coupled by plated-through vias in the substrates.

Also shown in FIG. 4 is a configuration in which the turns 10, 11 and 12 and the vertical conductive paths 14 are oriented so that current flows in a continuous path through the turns. For example, with respect to the orientation shown in FIG. 4, a first conductive path extends from the right or first end of the uppermost turn 10 that is coupled to a first terminal of an amplifier 20, and a vertical conductive path 14 extends downwards from the left or second end of the uppermost turn 10 and is coupled to the left or second end of the middle turn 11. Another vertical conductive path 14 extends from the right side or first end of the middle turn 11 and is coupled to the first end of the bottom turn 12. A second conductive path extends from the second end of bottom turn 12 and is coupled to a second terminal of the amplifier 20. Accordingly, inductive sensor 7 comprises a plurality of turns disposed on different substrates that are coupled to one another to provide a path through which current flows and is sensed by amplifier 20.

In the embodiment shown in FIG. 11, multiple turns are disposed on the same substrate layer. The inductive sensor 7 depicted in FIG. 11 has a spiral shape that is concentric with the flux-conducting orthogonal path 8. In addition, first and second ends of the spiral shape may be coupled to vertical conductive paths that are disposed on different planes—for example, one path may be disposed on the plane of an upper surface of a substrate, while the other path may be disposed on a plane of a lower surface of the same substrate, or on an upper or lower surface of a different substrate.

The Faraday cage 15 may be constructed using multilayer printed photo-resist circuit board printing technologies. The ground plane 31 on the bottom of layer 3 forms the top of the Faraday cage 15 and is physically connected through the arrangement of plated-through vias as the Faraday cage walls to the ground plane 31 on the top of circuit board layer 6 which forms the bottom of the Faraday cage. The resulting construction is a Faraday cage 15 that extends through a plurality of substrate layers and provides full electric and magnetic noise isolation for sensing components and conductive elements disposed within the cage. The Faraday cage 15 passes through circuit board layer 5 without creating an electrical connection. The Faraday cage may be isolated by an isolation gap 18 from the copper plating on either side of circuit board layer 5. Thus layer 5 is available to support circuit or inductive sensor components or both.

In an embodiment, the effect of the Faraday cage 15 is created by a system of plated-through vias or holes arranged in a pattern that provides a nearly full-ring magnetic flux and electric field shield for circuit paths of interest. The nearly full-ring shield effectively provides the equivalent of a screen wall to radiated energy. The constructed screen wall may comprise a series of holes spaced about two hole diameters apart along the circumference of two concentric circles whose radii differ by about one and one-half diameters of the filled via holes positioned orthogonally to both the circumference and the radius lines, such that the holes along the inner circle are set in between the holes in the outer circle. The spacing between adjacent vertical riser vias 17 may be, for example, greater than one via diameter and less than three via diameters, or greater than 1.5 diameters and no more than 2.5 diameters.

In some embodiments, each of the vertical riser vias 17 in the outer layer are disposed at radial locations corresponding to midpoints between adjacent vertical riser vias in the inner layer. Furthermore, adjacent vertical riser vias. This physical arrangement of the plated-through via holes provides a block to radiated electromagnetic energy without substantially weakening the circuit board material between the two circles.

In an embodiment, the Faraday cage 15 encloses every turn of the inductive sensor 7, as well as the vertical riser vias 32 that couple turns of the inductive sensor that are disposed on different substrates, and portions of the penetrating parts 82 that run through turns of the inductive sensor. In the embodiment shown in FIG. 1, enclosing both the inductive sensor 7 and the vertical riser vias 32 results in an asymmetrical Faraday cage with a first portion that encloses the inductive sensor 7 and a second portion that extends from the first portion and encloses the vertical riser vias 32.

Figure 13:
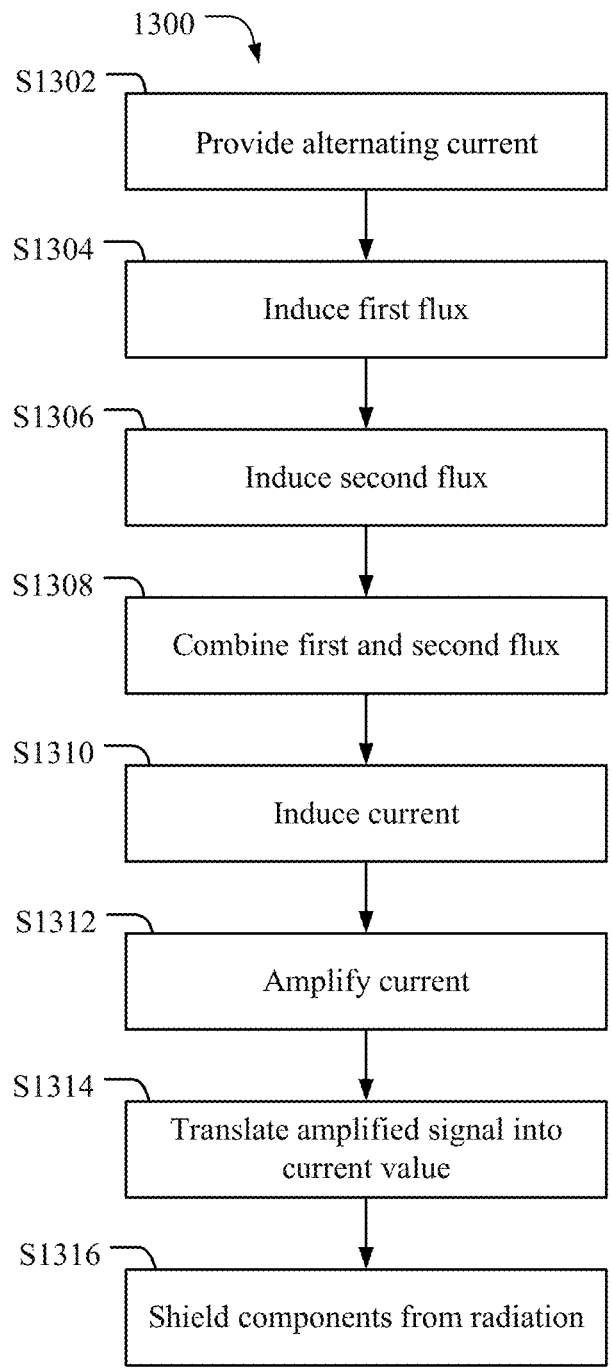
FIG. 13 shows a process of sensing or determining an amount of current flowing through a conductor or sensing a difference in current flowing between two conductors.

FIG. 13 illustrates an embodiment of a process 1300 for sensing or determining an amount of current flowing through a conductor, or sensing a difference in current flowing between two conductors. Process 1300 may include providing an alternating current through one or both of conductors 1 and 2, which may be supply and return currents for a circuit, at S1302. The current from the first conductor 1 induces a first flux in flux-conducting orthogonal path 8 which is orthogonal to the first conductor at S1304, and when a second conductor 2 is present, the second conductor induces a second flux in the flux-conducting orthogonal path 8 at S1306.

The first and second fluxes combine in the flux-conducting orthogonal path 8 at S1308, and may either cancel each other out when they are equal. When the fluxes are not equal, a difference flux flows through flux-conducting orthogonal path 8 which induces a current to flow in inductive sensor 7 at S1310. The inductive sensor 7 may be couple to an amplifier that amplifies the current at S1312 to determine a difference in current between the first and second conductors 1 and 2. When current only flows through a single conductor, the process 1300 may determine a magnitude of the current flowing through the conductor.

In some embodiments, determining the amount of current flowing through the single conductor, or determining the difference in current between two conductors may further comprise translating the amplified signal from inductive sensor 7 into a current value that corresponds to an actual current level in the first conductor, or an actual difference in currents, at S1314. The translation may be performed by a circuit or a programmable controller.

Process 1300 may further comprise shielding components involved in sensing the currents at S1316. In particular, S1316 may include shielding turns of an inductive sensor 7 by a Faraday cage that encloses the inductive sensor and any vertical conductive paths 14 that extend between turns of the inductive sensor that are disposed on different substrates. The Faraday cage may comprise vertical elements that are vias extending through at least one substrate layer, and ground planes that are co-planar with the substrates as top and bottom surfaces of the Faraday cage.

The invention claimed is:

1. A current sensor comprising:
a plurality of substrates;
a first conductor;
a magnetic flux conducting material comprising a first portion orthogonal to the first conductor and a second portion, each of the first and second portions penetrating the plurality of substrates;
an inductive sensor with a first loop oriented orthogonal to the second portion of the magnetic flux conducting material;
an amplifier coupled to the inductive sensor; and
a Faraday cage disposed between the first portion and the second portion of the magnetic flux conducting material.

2. The current sensor of claim 1, wherein the first conductor is positioned relative to the first portion of the magnetic flux conducting material such that when alternating current flows through the first conductor, a first magnetic flux is induced in the magnetic flux conducting material.

3. The current sensor of claim 2, wherein the magnetic flux conducting material further comprises a third portion that penetrates the plurality of substrates and is orthogonal to a second conductor.

4. The current sensor of claim 3, wherein the second conductor is positioned relative to the third portion of the magnetic flux conducting material such that when current flows through the second conductor, a second magnetic flux is induced in the magnetic flux conducting material, and a magnetic flux that is proportional to a difference between the first magnetic flux and the second magnetic flux is present in the second portion of the magnetic flux conducting material.

5. The current sensor of claim 1, further comprising a second conductor orthogonal to the first portion of the magnetic flux conducting material and symmetrical to the first conductor with respect to a length direction of the first portion of the magnetic flux conducting material.

6. The current sensor of claim 1, wherein the inductive sensor further comprises a second loop oriented orthogonal to the second portion of the magnetic flux conducting material and disposed on a different substrate from the first loop.

7. The current sensor of claim 1, wherein the first conductor has a width-to-thickness ratio of at least 50:1.

8. The current sensor of claim 1, wherein the Faraday cage extends through more than one substrate of the plurality of substrates.

9. The current sensor of claim 1, wherein the Faraday cage encloses a length of the second portion of the magnetic flux conducting material and the first loop.

10. The current sensor of claim 9, wherein the inductive sensor includes a second loop disposed on a different substrate from the first loop, and the Faraday cage encloses the first and second loops.

11. The current sensor of claim 1, wherein the Faraday cage includes an inner layer and an outer layer, and each of the inner and outer layers comprise a plurality of vertical riser vias that pass through at least two of the plurality of substrates.

12. The current sensor of claim 11, wherein each of the vertical riser vias in the outer layer are disposed at radial locations corresponding to midpoints between adjacent vertical riser vias in the inner layer.

13. A current sensor for sensing alternating current, the sensor comprising:
a first substrate;
a second substrate disposed under the first substrate;
a third substrate disposed under the second substrate;
a magnetic flux conducting material comprising a first portion orthogonal to a first conductor and a second portion, each of the first and second portions penetrating the plurality of substrates;
an inductive sensor with a first loop oriented orthogonal to the second portion of the magnetic flux conducting material; and
a Faraday cage disposed between the first portion and the second portion of the magnetic flux conducting material.

14. The current sensor of claim 13, further comprising:
an amplifier configured to amplify a signal from the inductive sensor and located on an upper substrate that is disposed above the first substrate.

15. The current sensor of claim 13, wherein the first conductor is disposed on an upper surface of the first substrate, and a second conductor is disposed on a lower surface of the third substrate, and
the first and second conductors are arranged to induce magnetic flux in the magnetic flux conducting material when the alternating current flows through the first and second conductors.

16. The current sensor of claim 15, wherein the first and second conductors have width-to-thickness ratios of at least 50:1.

17. The current sensor of claim 13, wherein the inductive sensor comprises a first loop disposed on the first substrate, a second loop disposed on the second substrate, and a third loop disposed on the third substrate.

18. The current sensor of claim 17, wherein the Faraday cage extends through the first, second and third substrates and encloses the first, second and third loops.

19. The current sensor of claim 17, wherein the Faraday cage includes an inner layer and an outer layer, and each of the inner and outer layers comprise a plurality of vertical riser vias that pass through at least two of the plurality of substrates.

20. The current sensor of claim 19, wherein each of the vertical riser vias in the outer layer are disposed at radial locations corresponding to midpoints between adjacent vertical riser vias in the inner layer.

* * * * *